(12) United States Patent
Tsai et al.

(10) Patent No.: US 9,887,290 B2
(45) Date of Patent: Feb. 6, 2018

(54) SILICON GERMANIUM SOURCE/DRAIN REGIONS

(71) Applicant: Taiwan Semiconductor Manufacturing Company, Ltd., Hsin-Chu (TW)

(72) Inventors: Ji-Yin Tsai, Zhudong Township (TW); Yao-Tsung Huang, Kaohsiung (TW); Chih-Hsin Ko, Fongshan (TW); Clement Hsingjen Wann, Carmel, NY (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 146 days.

(21) Appl. No.: 14/609,107

(22) Filed: Jan. 29, 2015

(65) Prior Publication Data

US 2015/0137198 A1    May 21, 2015

Related U.S. Application Data

(63) Continuation of application No. 13/178,294, filed on Jul. 7, 2011, now Pat. No. 8,962,400.

(51) Int. Cl.
*H01L 29/78* (2006.01)
*H01L 21/8238* (2006.01)
(Continued)

(52) U.S. Cl.
CPC .. *H01L 29/7848* (2013.01); *H01L 21/823807* (2013.01); *H01L 21/823814* (2013.01);
(Continued)

(58) Field of Classification Search
CPC ............... H01L 29/7848; H01L 29/36; H01L 21/823431; H01L 21/82382;
(Continued)

(56) References Cited

U.S. PATENT DOCUMENTS 3,909,304 A    9/1975    Cho
6,649,492 B2    11/2003    Chu et al.
(Continued)

FOREIGN PATENT DOCUMENTS

JP    2009164454    7/2009
KR    20090101831    9/2009
(Continued)

OTHER PUBLICATIONS

Wong, Hoong-Shing et al., "Silicon-Carbon Stressors With High Substitutional Carbon Concentration and in Situ Doping Formed in Source/Drain Extensions of n-Channel Transistors," IEEE Electron Device Letters, vol. 29, No. 5, May 2008, pp. 460-463.

*Primary Examiner* — Joshua King
(74) *Attorney, Agent, or Firm* — Slater Matsil, LLP

(57) ABSTRACT

A method includes forming a gate stack over a semiconductor region, and recessing the semiconductor region to form a recess adjacent the gate stack. A silicon-containing semiconductor region is epitaxially grown in the recess to form a source/drain stressor. Arsenic is in-situ doped during the step of epitaxially growing the silicon-containing semiconductor region.

19 Claims, 10 Drawing Sheets

(51) Int. Cl.
  *H01L 29/10* (2006.01)
  *H01L 29/06* (2006.01)
  *H01L 29/08* (2006.01)
  *H01L 29/161* (2006.01)
  *H01L 29/167* (2006.01)
  *H01L 29/36* (2006.01)
  *H01L 29/66* (2006.01)

(52) U.S. Cl.
  CPC ...... *H01L 29/0653* (2013.01); *H01L 29/0847* (2013.01); *H01L 29/1054* (2013.01); *H01L 29/161* (2013.01); *H01L 29/167* (2013.01); *H01L 29/36* (2013.01); *H01L 29/66636* (2013.01); *H01L 29/66651* (2013.01); *H01L 29/66795* (2013.01); *H01L 29/665* (2013.01); *H01L 29/66628* (2013.01); *Y10S 438/933* (2013.01)

(58) Field of Classification Search
  CPC ............. H01L 27/0886; H01L 27/0924; H01L 27/10826; H01L 27/10879; H01L 27/1211; H01L 29/41791; H01L 29/66795–29/66818; H01L 29/785–29/7856; H01L 2924/13067
  See application file for complete search history.

(56) References Cited

U.S. PATENT DOCUMENTS

| | | | |
|---|---|---|---|
| 6,858,506 B2 * | 2/2005 | Chang | H01L 29/1054 257/E21.438 |
| 7,112,848 B2 | 9/2006 | Lee | |
| 7,132,338 B2 | 11/2006 | Samoilov et al. | |
| 7,518,196 B2 | 4/2009 | Chau et al. | |
| 7,642,180 B2 | 1/2010 | Ai-Bayati et al. | |
| 7,875,521 B2 | 1/2011 | Shimamune et al. | |
| 7,910,415 B2 | 3/2011 | Mishima | |
| 8,110,486 B2 | 2/2012 | Matsumoto et al. | |
| 8,222,657 B2 * | 7/2012 | Xu | H01L 33/0041 257/613 |
| 8,338,259 B2 | 12/2012 | Wu et al. | |
| 8,551,845 B2 | 10/2013 | Chan et al. | |
| 8,647,941 B2 * | 2/2014 | Chien | H01L 21/76283 257/E21.461 |
| 2002/0123167 A1 * | 9/2002 | Fitzgerald | H01L 21/02381 438/47 |
| 2002/0125497 A1 * | 9/2002 | Fitzgerald | H01L 21/02381 257/191 |
| 2003/0052406 A1 | 3/2003 | Lochtefeld et al. | |
| 2003/0057439 A1 * | 3/2003 | Fitzgerald | H01L 21/823807 257/192 |
| 2003/0089901 A1 * | 5/2003 | Fitzgerald | H01L 21/02381 257/19 |
| 2004/0026765 A1 * | 2/2004 | Currie | H01L 21/823807 257/616 |
| 2006/0057859 A1 | 3/2006 | Chen | |
| 2007/0059875 A1 | 3/2007 | Mishima | |
| 2007/0111439 A1 | 5/2007 | Jung et al. | |
| 2007/0128782 A1 | 6/2007 | Liu et al. | |
| 2007/0131969 A1 | 6/2007 | Sanuki et al. | |
| 2007/0145487 A1 * | 6/2007 | Kavalieros | H01L 29/66628 257/368 |
| 2008/0220579 A1 * | 9/2008 | Pal | H01L 29/0847 438/265 |
| 2008/0251851 A1 | 10/2008 | Pan et al. | |
| 2009/0166625 A1 * | 7/2009 | Ting | H01L 29/66636 257/51 |
| 2009/0239344 A1 | 9/2009 | Jeong et al. | |
| 2010/0252816 A1 | 10/2010 | Ko et al. | |
| 2011/0147828 A1 | 6/2011 | Murthy et al. | |
| 2012/0104470 A1 | 5/2012 | Ponoth et al. | |

FOREIGN PATENT DOCUMENTS

| | | |
|---|---|---|
| KR | 20100016417 | 2/2010 |
| KR | 20110111550 | 10/2011 |

* cited by examiner

SILICON GERMANIUM SOURCE/DRAIN REGIONS

PRIORITY CLAIM AND CROSS-REFERENCE

This application is a continuation of U.S. patent application Ser. No. 13/178,294, entitled "In-Situ Doping of Arsenic for Source and Drain Epitaxy," filed on Jul. 7, 2011, which application is incorporated herein by reference.

BACKGROUND

The source and drain regions of n-type metal-oxide-semiconductor (NMOS) field-effect transistors (FETs) need to have n-type impurities. The commonly used n-type impurities include phosphorous and arsenic. Conventionally, when arsenic is doped, it is implanted into the source and drain regions, for example, by using $AsH_3$ as the dopant-containing process gas.

The implanted arsenic, however, is not activated. To cure the implanted arsenic, and also to cure the crystalline structure in the source and drain regions, thermal processes are necessary. The thermal processes cause the undesirable dopant diffusion, which leads to the loss of junction abruptness. Furthermore, the thermal processes also cause thermal budget issues in the manufacturing of the integrated circuits.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

An n-type metal-oxide-semiconductor (NMOS) field-effect transistor (FET) and the method of forming the same are provided in accordance with embodiments. The intermediate stages of manufacturing various embodiments are illustrated. The variations of the embodiments are discussed. Throughout the various views and illustrative embodiments, like reference numbers are used to designate like elements.

Figure 1:
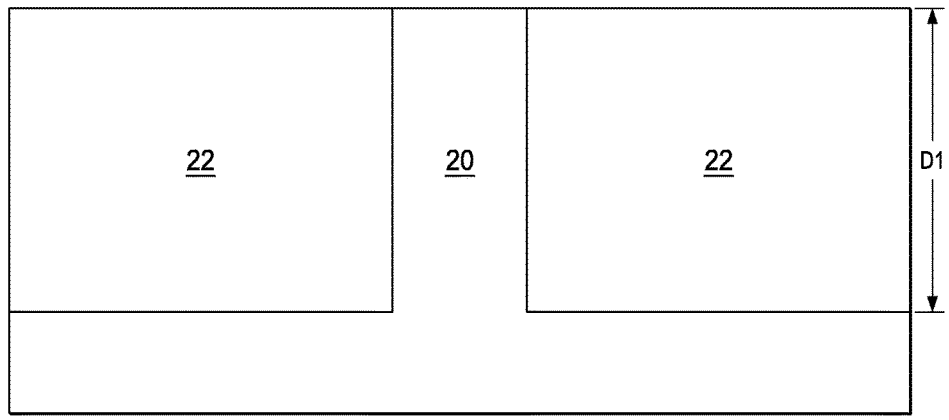
FIGS. 1 through 9 are cross-sectional views of intermediate stages in the manufacturing of an n-type metal-oxide-semiconductor (NMOS) fin field-effect transistor (FinFET) in accordance with embodiments.

Referring to FIG. 1, substrate 20, which may be a portion of a semiconductor wafer, is provided. Substrate 20 may be a semiconductor substrate. In an embodiment, substrate 20 is a silicon substrate with no germanium therein, although it may also be formed of silicon germanium (SiGe). Insulators such as shallow trench isolation (STI) regions 22 are formed in substrate 20. Depth D1 of STI regions 22 may be between about 50 nm and about 300 nm, or between about 100 nm and about 400 nm. It is realized, however, that the dimensions recited throughout the description are merely examples, and may be changed to different values. STI regions 22 may be formed by recessing semiconductor substrate 20 to form openings, and then filling the openings with dielectric materials. STI regions 22 may include two neighboring regions having their sidewalls facing each other, with a portion of substrate 20 between, and adjoining, the two neighboring STI regions 22.

Figure 2:
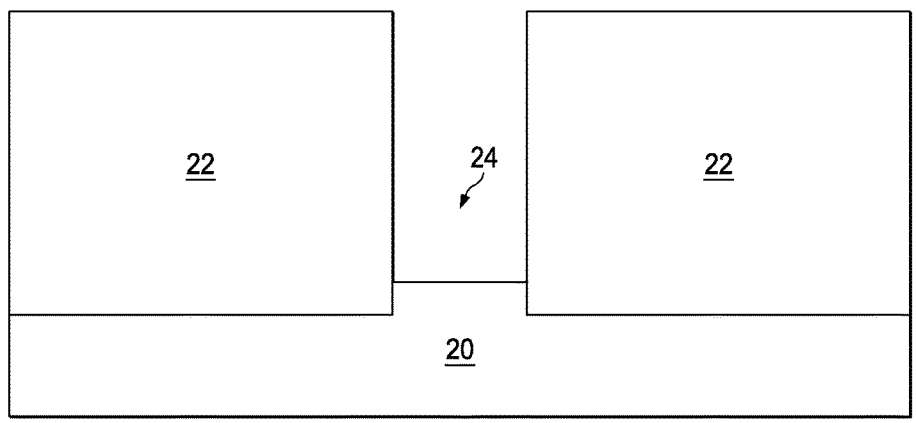

Referring to FIG. 2, the portion of substrate 20 that is between two neighboring STI regions 22 is removed, forming opening 24. In an embodiment, the bottom of opening 24 is level with the bottoms of STI regions 22. In alternative embodiments, the bottom of opening 24 may be lower than or higher than the bottoms of STI regions 22.

Figure 3:
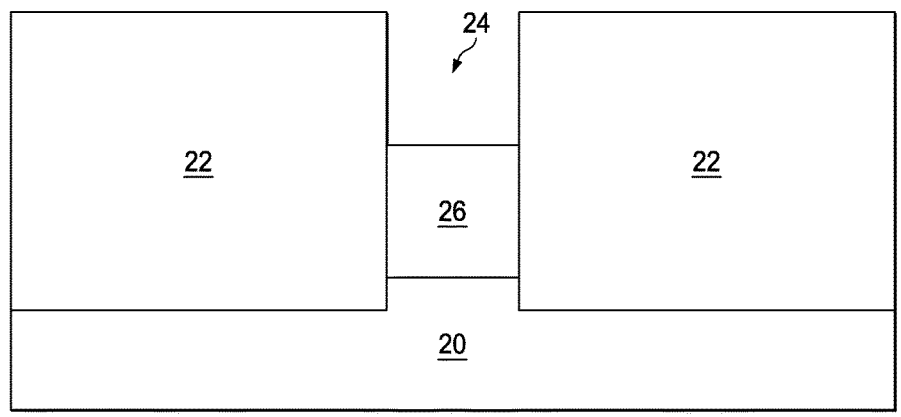

FIG. 3 illustrates the formation of SiGe layer 26 in opening 24. The methods for forming SiGe layer 26 include, for example, selective epitaxial growth (SEG). SiGe layer 26 may be expressed as $Si_{1-x}Ge_x$, wherein x is the atomic percentage of germanium, and x is greater than 0, and may be equal to or less than 1. When x is equal to about 1, SiGe layer 26 is formed of substantially pure germanium. In an exemplary embodiment, x is between about 0.5 and about 1.0. SiGe layer 26 may be fully relaxed regardless of the material and the structure of substrate 20.

Figure 4:
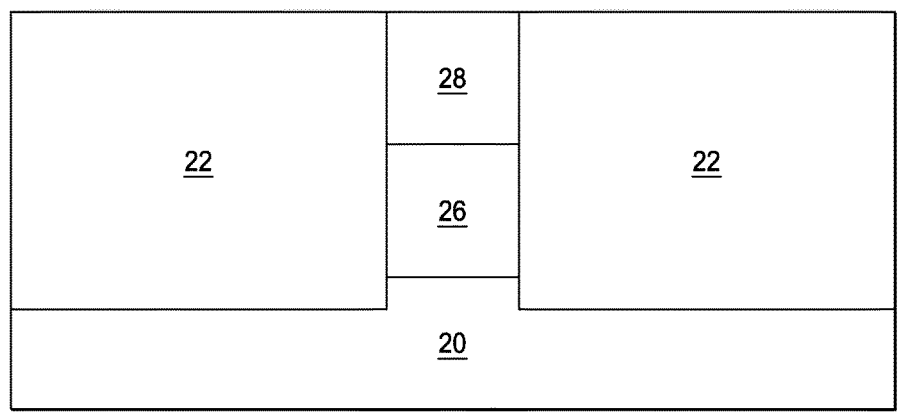

In FIG. 4, semiconductor layer 28 is epitaxially grown on SiGe layer 26. In an embodiment, semiconductor layer 28 is formed of silicon germanium, which may be expressed as $Si_{1-y}Ge_y$, wherein value y is the atomic percentage of germanium in the silicon germanium, and value y may be greater than or equal to 0, and is less than 1. Atomic percentage y of semiconductor layer 28 may be smaller than atomic percentage x of silicon germanium layer 26. In an exemplary embodiment, atomic percentage y is between about 0 and about 0.7. In other embodiments, semiconductor layer 28 is formed of substantially pure silicon. In yet other embodiments, semiconductor layer 28 may include a III-V compound semiconductor that comprises a group-III element and a group-V element. The III-V compound semiconductor may include, but is not limited to, GaAs, InP, GaN, InGaAs, InAlAs, GaSb, AlSb, AlAs, AlP, GaP, combinations thereof, and multi-layers thereof. Semiconductor layer 28 may have a lattice constant smaller than the lattice constant of silicon germanium layer 26. Accordingly, a tensile stress may be generated in semiconductor layer 28.

Figure 5A:
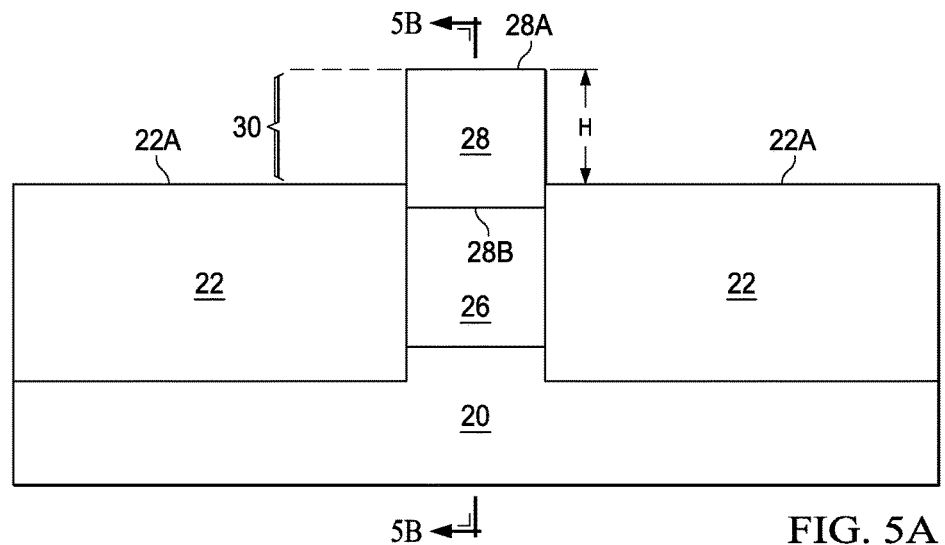
Figure 5B:
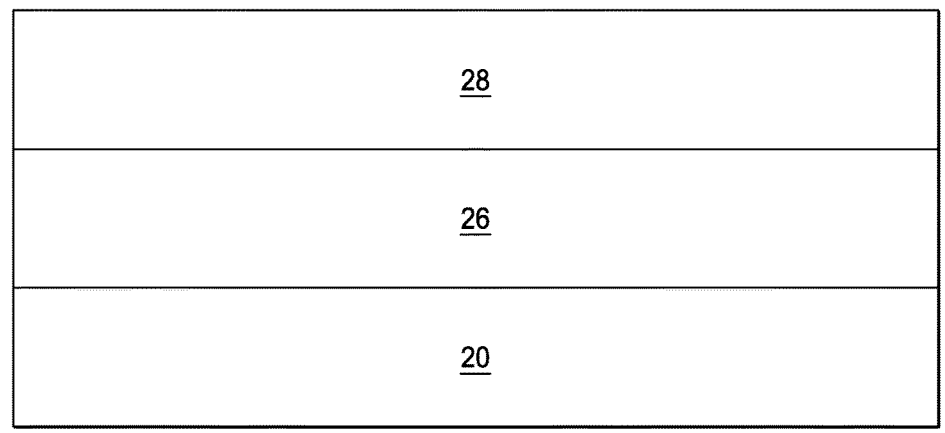

Referring to FIG. 5A, STI regions 22 are recessed, so that top surface 28A of semiconductor layer 28 is higher than top surfaces 22A of the remaining portions of STI regions 22. In an embodiment, top surfaces 22A may be at an intermediate level that is between top surface 28A and bottom surface 28B of semiconductor layer 28. In alternative embodiments, top surfaces 22A may be level with, or lower than, bottom surface 28B. Throughout the description, the portion of semiconductor layer 28 (and possibly SiGe layer 26) that are over top surfaces 22A is referred to as fin 30. Fin 30 has fin height H. In an exemplary embodiment, fin height H is between about 10 nm and about 50 nm. FIG. 5B illustrates a cross-sectional view of the structure shown in FIG. 5A, wherein the cross-sectional view is obtained from the vertical plane crossing line 5B-5B in FIG. 5A.

Figure 6A:
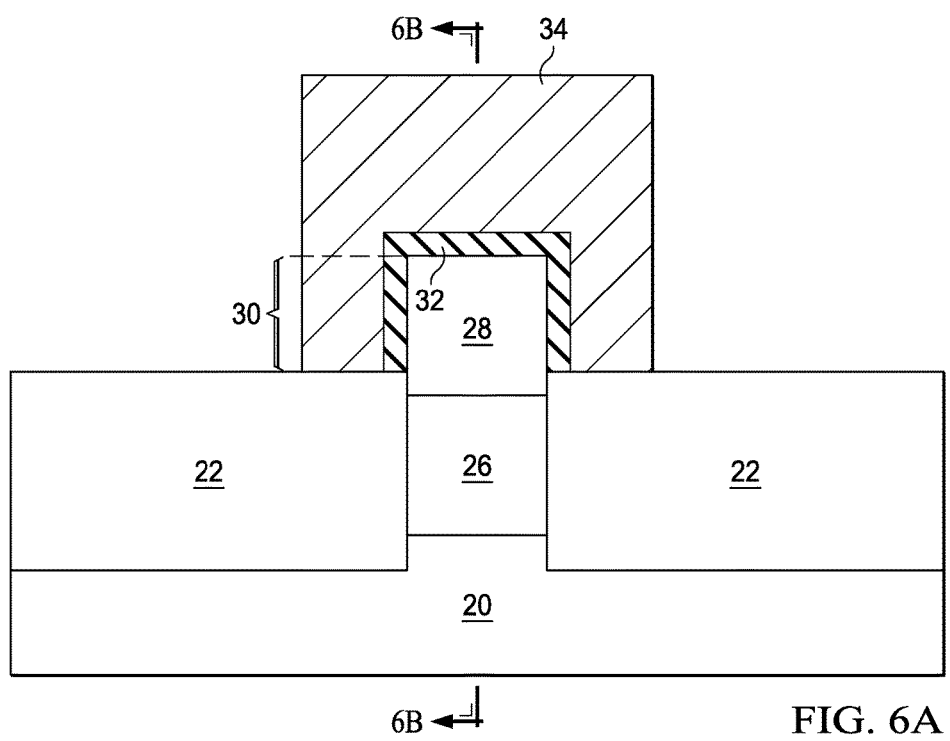
Figure 6B:
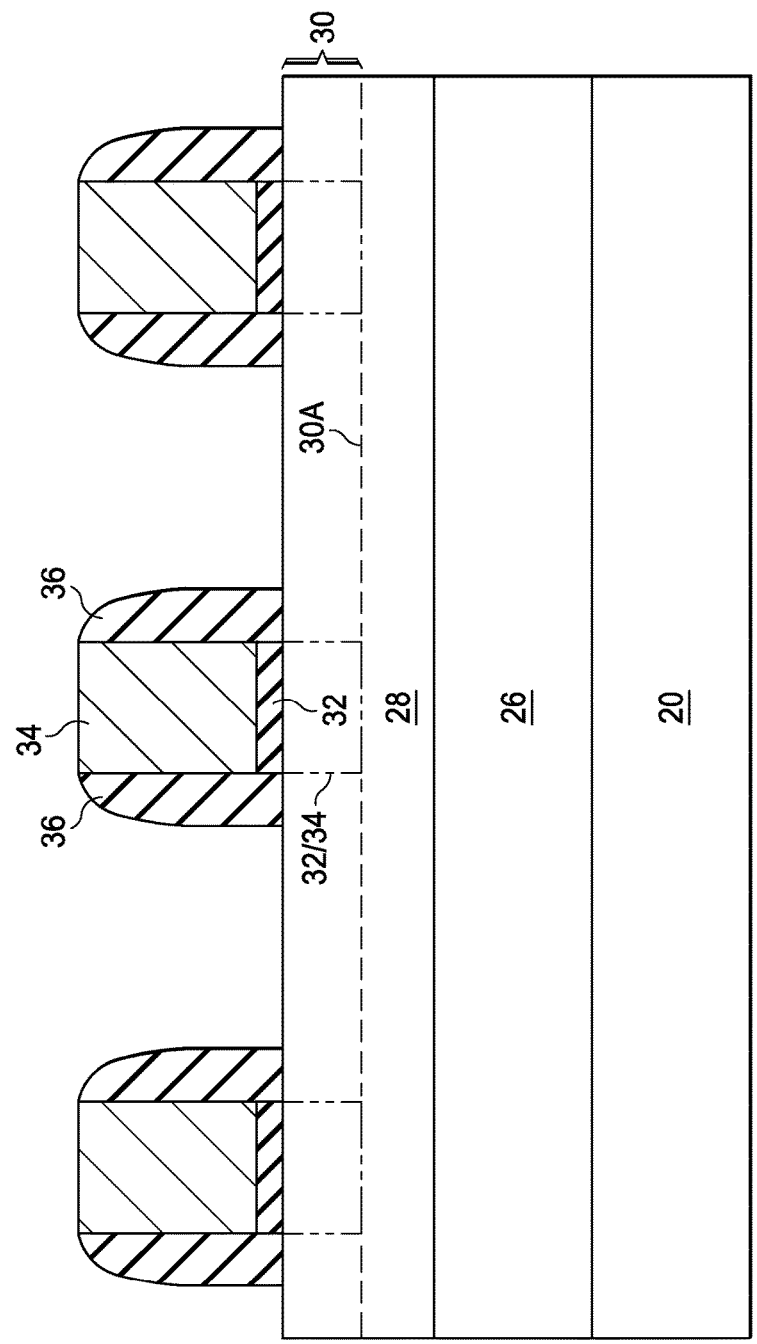

FIGS. 6A and 6B illustrate the formation of gate dielectric 32, gate electrode 34, and gate spacers 36. Referring to FIG. 6A, gate dielectric 32 is formed on the sidewalls and the top surface of fin 30. The material of gate dielectric 32 may include silicon oxide, silicon nitride, high-k dielectric materials such as Hf-containing dielectrics, and the like. Gate electrode 34 may be formed of polysilicon, metals, metal silicides, and/or the like. FIG. 6B is a cross-sectional view of the structure shown in FIG. 6A, wherein the cross-sectional view is obtained from the vertical plane crossing line 6B-6B in FIG. 6A. Gate spacers 36 are formed on the sidewalls of gate electrode 34. In FIG. 6B, dotted lines are used to illustrate the portions of gate dielectric 32 and gate electrode 34 that are on the sidewalls of fin 30, since these portions of gate dielectric 32 and gate electrode 34 are not in the plane of FIG. 6B. Furthermore, in FIG. 6B, the bottom level of fin 30 is marked as 30A.

Figure 7:
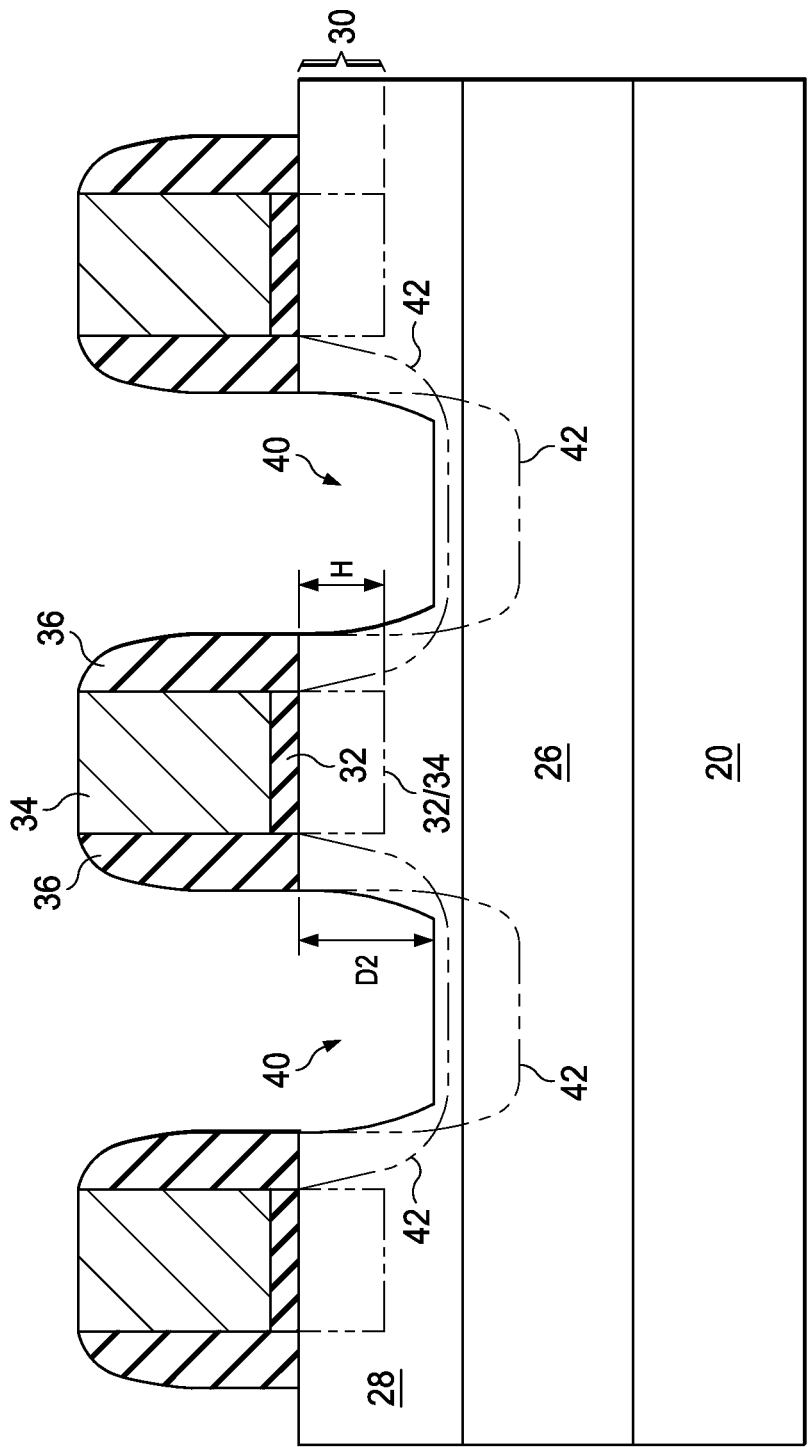

Referring to FIG. 7, which is a cross-sectional view obtained from the same plane as in FIG. 6B, recesses 40 are formed, for example, by etching into semiconductor layer 28. In an embodiment, recesses 40 extend into semiconductor layer 28, and do not extend into SiGe layer 26. In alternative embodiments, recesses extend down into SiGe layer 26. Depth D2 of recesses 40 may be between about one times to two times fin height H of fin 30. The edges of recesses 40 may be substantially vertically aligned to the outer edges of gate spacers 36. In other embodiments, recesses 40 may extend to directly underlying gate spacers 36. Dashed lines 42 illustrate the positions of the sidewalls and bottoms of recesses 40 in accordance with alternative embodiments.

Figure 8:
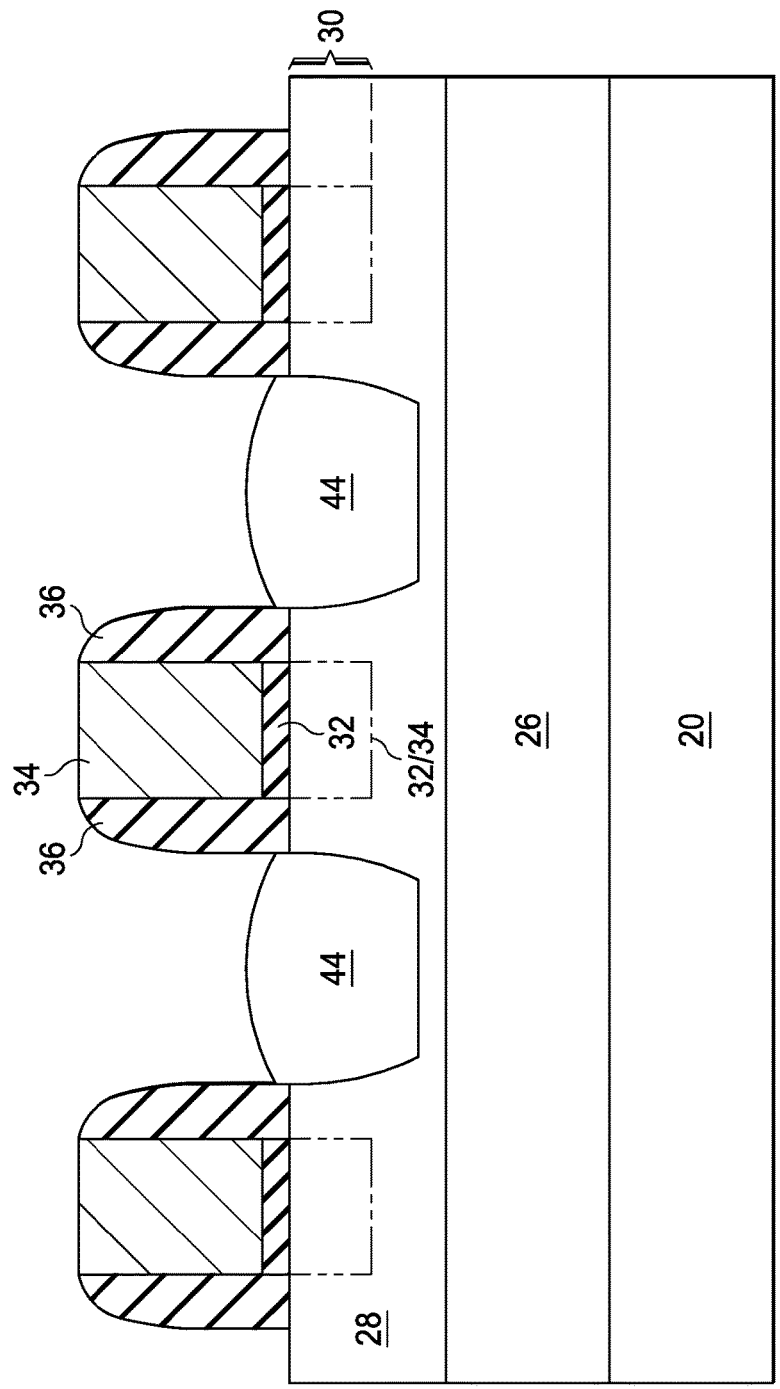

FIG. 8 illustrates the epitaxial growth of source/drain stressors 44, which may also be formed through SEG. In an embodiment, the epitaxy of source/drain stressors 44 is performed using a chemical vapor deposition (CVD) method such as low-pressure CVD (LPCVD), ultra low-pressure CVD (UHVCVD), or the like. During the epitaxial growth of source/drain stressors 44 (which are also source/drain regions), arsenic is in-situ doped with the proceeding of source/drain stressors 44. In an embodiment, the process gas for doping arsenic comprises $AsH_3$. In alternative embodiments, the process gas for doping arsenic may comprise trimethyl arsenic (TMAs), tertiarybutylarsine (TBAs), and combination thereof. The resulting n-type impurity (arsenic) concentration in source/drain stressors 44 may be between about $10^{19}/cm^3$ and about $10^{22}/cm^3$. Source/drain stressors 44 have a lattice constant smaller than the lattice constant of fin 30. Accordingly, source/drain stressors 44 introduces a tensile stress to the channel region of the resulting FinFET. The material of source/drain stressors 44 may be expressed as $Si_{1-z}Ge_z$, wherein z represents the atomic percentage of germanium, and is greater than or equal to 0, and is smaller than 1. When z is equal to about 0, source/drain stressors 44 are silicon regions that have substantially no germanium added. Germanium percentage z in source/drain stressors 44 may be smaller than germanium atomic percentage x in SiGe layer 26 and germanium atomic percentage y in semiconductor layer 28. In an embodiment, a difference between germanium atomic percentages x and z is greater than about 0.7.

Figure 9:
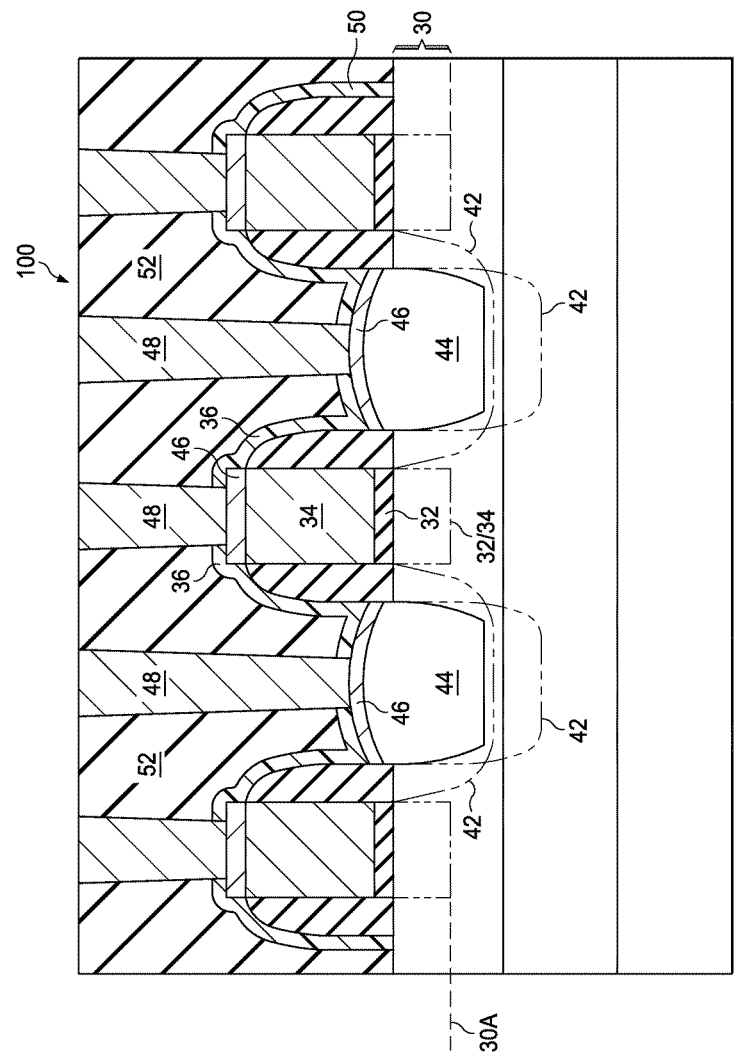

FIG. 9 illustrates the formation of the remaining components of NMOS FinFET 100, which components include silicide regions 46, contact plugs 48, contact etch stop layer 50, and inter-layer dielectric (ILD) 52. In the resulting NMOS FinFET 100, depending on the bottom position of recesses 40 (FIG. 7), source/drain stressors 44 may extend into SiGe layer 26 (as shown by dashed lines 42), or alternatively, not extend into SiGe layer 26. Furthermore, as also shown by dashed lines 42, source/drain stressors 44 may extend down to lower than bottom level 30A of fin 30, or have bottom surfaces substantially level with bottom level 30A of fin 30.

Figure 10:
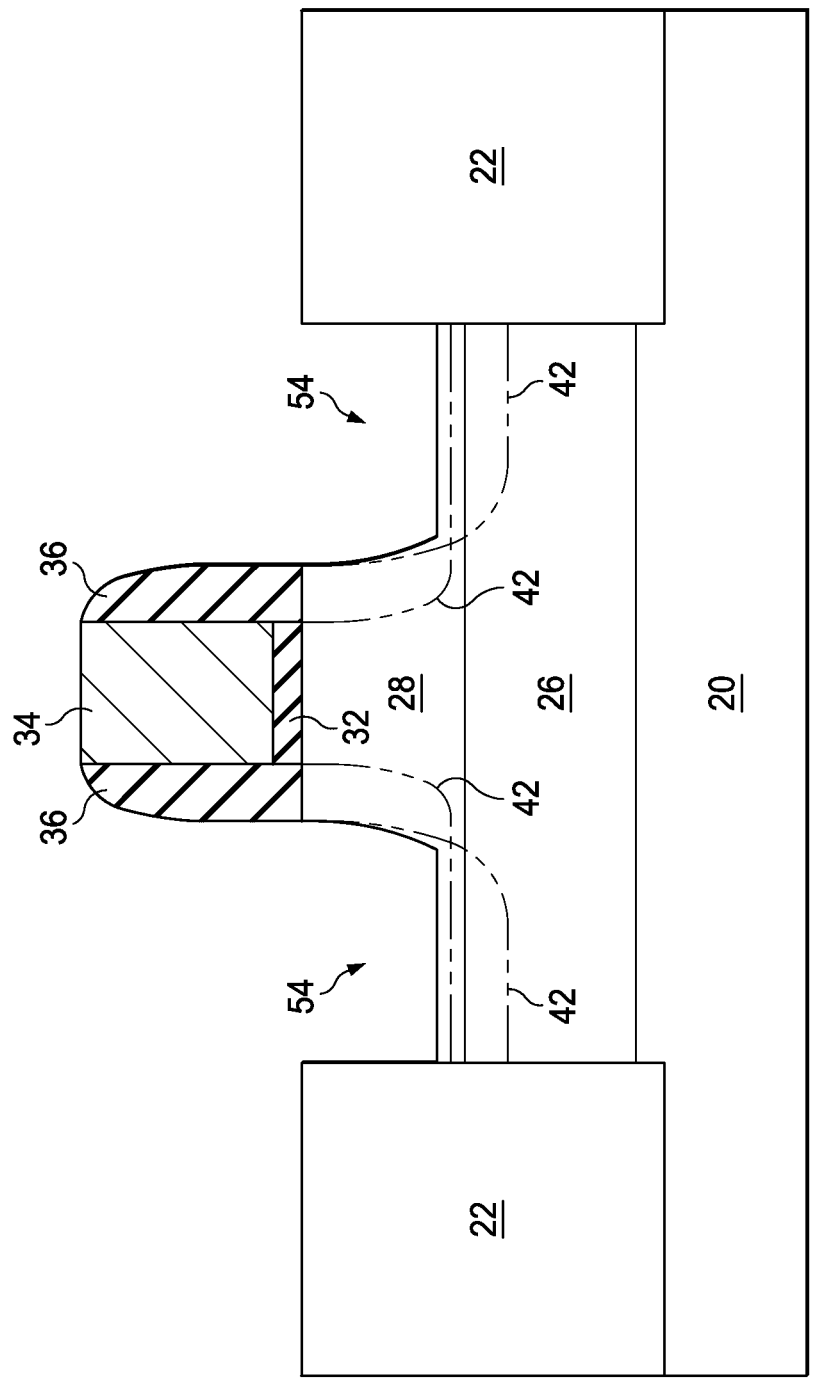
FIGS. 10 and 11 are cross-sectional views of intermediate stages in the manufacturing of a planar n-type FET in accordance with alternative embodiments.
Figure 11:
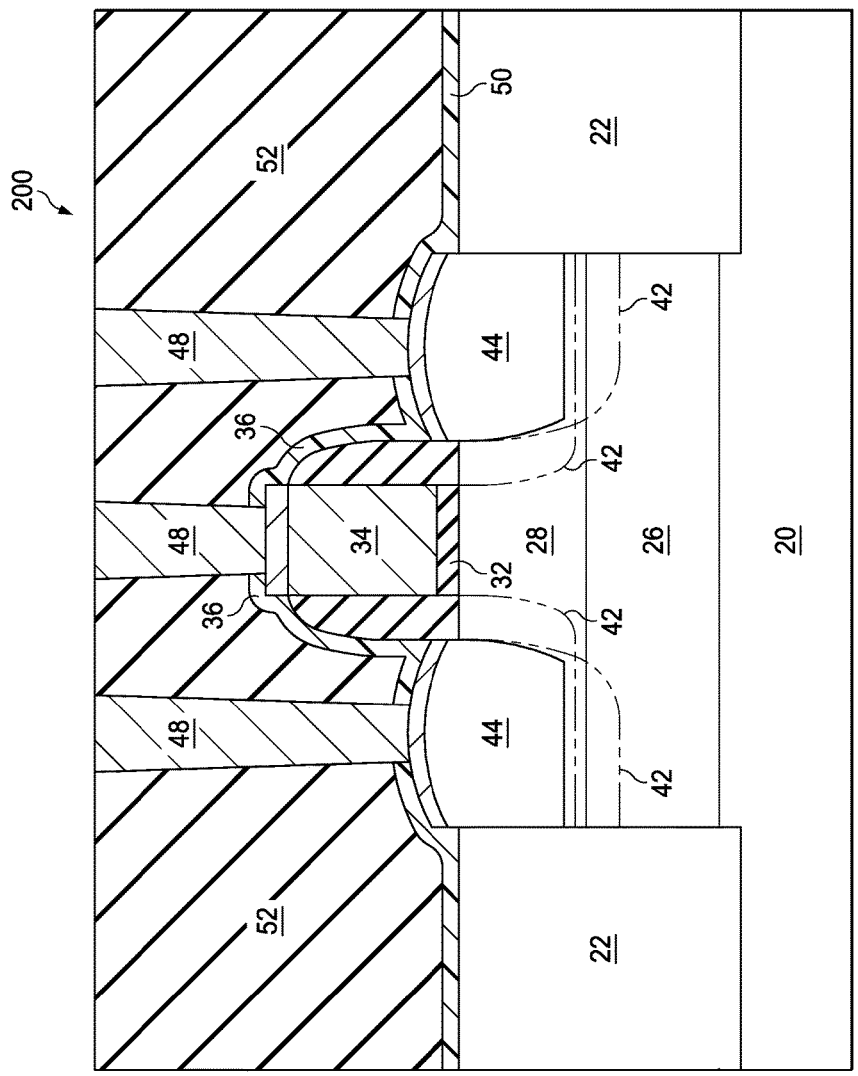

FIGS. 10 and 11 are cross-sectional views of intermediate stages in the manufacturing of planar NMOS FET 200 in accordance with alternative embodiments. Unless specified otherwise, the reference numerals in these embodiments represent like elements in the embodiments illustrated in FIGS. 1 through 9. The materials, dimensions, and the process steps for forming SiGe layer 26, semiconductor layer 28, and source/drain stressors 44 may be essentially the same as the formation of the respective components in NMOS FinFET 100. Referring to FIG. 10, the formation process may include forming STI regions 22 in substrate 20. The gate stack including gate dielectric 32 and gate electrode 34 is formed on substrate 20, followed by the formation of gate spacers 36. Recesses 54 are then formed in substrate 20. Dashed lines 42 illustrate the alternative positions of the sidewalls and the bottoms of recesses 54. Referring to FIG. 11, source/drain stressors 44 are epitaxially grown in recesses 54, and arsenic is in-situ doped with the proceeding of the epitaxy process, and is not introduced through implantation. In subsequent process steps, silicide regions 46, contact plugs 48, contact etch stop layer 50, and ILD 52 are formed using essentially the same methods as for forming the corresponding components in NMOS FinFET 100.

In the embodiments, arsenic is in-situ doped with the proceeding of the epitaxy of source/drain stressors. Therefore, no thermal activation is needed, and the resulting undesirable diffusion of arsenic is reduced. In addition, the concentrations of the in-situ doped arsenic are higher than that are doped through implantations. As a result of the increased impurity concentrations, the resistivities of the source/drain regions are reduced.

In accordance with embodiments, a method includes forming a gate stack over a semiconductor region, and recessing the semiconductor region to form a recess adjacent the gate stack. A silicon-containing semiconductor region is epitaxially grown in the recess to form a source/drain stressor. Arsenic is in-situ doped during the step of epitaxially growing the silicon-containing semiconductor region.

In accordance with other embodiments, a method includes epitaxially growing a silicon germanium layer over a portion of a silicon substrate, and epitaxially growing a semiconductor layer over the silicon germanium layer. The semiconductor layer has a first lattice constant smaller than a second lattice constant of the silicon germanium layer. A gate stack is formed over the semiconductor layer. A portion of the semiconductor layer forms a channel region of an NMOS FET. The semiconductor layer is recessed to form recesses on opposite sides of the gate stack. Semiconductor stressors are epitaxially grown in the recesses, wherein the semiconductor stressors have a third lattice constant smaller than the first lattice constant. During the step of epitaxially growing the semiconductor stressors, arsenic is in-situ doped.

In accordance with yet other embodiments, a method includes forming isolation regions in a silicon substrate, forming a gate stack on a top surface of the silicon substrate, and recessing portions of the silicon substrate on opposite sides of the gate stack to form recesses. Silicon-containing semiconductor regions are epitaxially grown in the recesses to form source/drain regions of a planar transistor. The step of epitaxially growing is performed simultaneously with an in-situ doping of arsenic.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A structure comprising:
    isolation regions extending into a semiconductor substrate;
    a semiconductor region between opposite portions of the isolation regions, wherein the semiconductor region comprises a portion extending to lower than top surfaces of the isolation regions, and the semiconductor region comprises:
        a first silicon germanium layer having a first germanium concentration; and
        a second silicon germanium layer over the first silicon germanium layer, wherein the second silicon germanium layer has a second germanium concentration lower than the first germanium concentration;
    a gate stack over the second silicon germanium layer;
    a source/drain region connected to an end of the semiconductor region, wherein the source/drain region comprises a silicon germanium stressor having a third germanium concentration greater than zero and lower than the first germanium concentration and the second germanium concentration, the silicon germanium stressor having a top surface protruding over a first topmost surface of the second silicon germanium layer and a second topmost surface of the isolation regions, a first sidewall of the silicon germanium stressor contacting a sidewall of the gate stack; and
    an etch stop layer disposed over the gate stack, the silicon germanium stressor, and the isolation regions, a second sidewall of the silicon germanium stressor contacting the etch stop layer.

2. The structure of claim 1, wherein the gate stack and the source/drain region are comprised in an N-type Metal-Oxide-Semiconductor (MOS) Field-Effect Transistor.

3. The structure of claim 1, wherein the semiconductor region comprises a top portion protruding over top surfaces of the isolation regions, wherein the gate stack comprises a first portion directly over the semiconductor region, and a second portion on a sidewall of the top portion.

4. The structure of claim 1, wherein the source/drain region penetrates through the second silicon germanium layer and extends into the first silicon germanium layer, with a bottommost surface of the source/drain region at a level between a top surface and a bottom surface of the first silicon germanium layer, and the gate stack has a bottom surface in physical contact with a top surface of the second silicon germanium layer.

5. The structure of claim 4, wherein a bottom of the source/drain region is at an intermediate level between a top surface and a bottom surface of the first silicon germanium layer.

6. The structure of claim 1, wherein a top surface of the isolation regions is higher than an interface between the first silicon germanium layer and the second silicon germanium layer and lower than a top surface of the second silicon germanium layer.

7. The structure of claim 1, wherein a bottom surface of the source/drain region is lower than a top surface of the isolation regions.

8. A structure comprising:
    isolation regions in a silicon substrate;
    a first silicon germanium layer over and in contact with a portion of the silicon substrate, wherein the first silicon germanium layer has a first germanium concentration, a topmost surface of the first silicon germanium layer being lower than a topmost surface of each of the isolation regions, a bottom surface of the first silicon germanium layer being higher than a lowermost surface of each of the isolation regions;
    a second silicon germanium layer over and in contact with the first silicon germanium layer, wherein the second silicon germanium layer has a second germanium concentration lower than the first germanium concentration, a top portion of the second silicon germanium layer protruding over a top surface of the isolation regions, a bottom portion of the second silicon germanium layer being lower than the top surface of the isolation regions;
    a gate stack over the second silicon germanium layer, wherein a portion of the second silicon germanium layer forms a channel region of an n-type metal-oxide-semiconductor (NMOS) field-effect transistor (FET), the gate stack comprising a first portion directly over the second silicon germanium layer, and a second portion being on a sidewall of the top portion of the second silicon germanium layer; and
    semiconductor stressors on opposite sides of the gate stack, wherein the semiconductor stressors comprise silicon germanium having a third germanium concentration greater than zero and lower than both the first germanium concentration and the second germanium concentration.

9. The structure of claim 8, wherein the first silicon germanium layer is in contact with a portion of the silicon substrate, and the second silicon germanium layer is in contact with a top surface of the first silicon germanium layer, and the gate stack is in physical contact with a top surface of the second silicon germanium layer.

10. The structure of claim 8, wherein each of the first silicon germanium layer and the second silicon germanium layer comprises a portion lower than a top surface of the isolation regions and between opposite portions of the isolation regions.

11. The structure of claim 8, wherein the gate stack comprises a gate dielectric, and wherein the gate dielectric is in contact with a top surface of the second silicon germanium layer, and a bottommost surface of the semiconductor stressors is at a level between a top surface and a bottom surface of the first silicon germanium layer.

12. The structure of claim 8, wherein the semiconductor stressors penetrate through the second silicon germanium layer to contact the first silicon germanium layer.

13. A structure comprising:
    isolation regions extending into a silicon substrate;
    a semiconductor region between opposite portions of the isolation regions, wherein the semiconductor region comprises a portion extending to lower than top surfaces of the isolation regions, and the semiconductor region comprises:

a first silicon germanium layer having a first germanium concentration, a top surface of the first silicon germanium layer being lower than an uppermost surface of the isolation regions, a bottom surface of the first silicon germanium layer being higher than a lowermost surface of the isolation regions; and a second silicon germanium layer over the first silicon germanium layer, wherein the second silicon germanium layer has a second germanium concentration lower than the first germanium concentration, wherein a top portion of the second silicon germanium layer protrudes over top surfaces of the isolation regions;

a gate stack on a top surface and sidewalls of the top portion of the second silicon germanium layer; and source/drain regions on opposite sides of the gate stack, wherein the source/drain regions penetrate through the second silicon germanium layer and extends into a top portion of the first silicon germanium layer, and the source/drain regions comprise silicon germanium having a third germanium concentration greater than zero and lower than both the first germanium concentration and the second germanium concentration.

14. The structure of claim 13, wherein the second silicon germanium layer comprises a first portion lower than the top surfaces of the isolation regions, and a second portion higher than the top surfaces of the isolation regions.

15. The structure of claim 14, wherein a bottommost surface of the source/drain regions is at a level between a top surface and a bottom surface of the first silicon germanium layer.

16. The structure of claim 13, wherein the source/drain regions comprise arsenic.

17. The structure of claim 15, wherein the gate stack comprises a gate dielectric, and the gate dielectric is in contact with a top surface of the second silicon germanium layer.

18. The structure of claim 13, wherein the source/drain regions comprise bottom surfaces at an intermediate level between a top surface and a bottom surface of the first silicon germanium layer.

19. The structure of claim 13, wherein the source/drain regions have a lattice constant smaller than a lattice constant of the second silicon germanium layer.

* * * * *